US011859152B2

(12) United States Patent
Horiba et al.

(10) Patent No.: US 11,859,152 B2
(45) Date of Patent: Jan. 2, 2024

(54) SUBSTRATE PATTERN FILLING COMPOSITION AND USE OF THE SAME

(71) Applicant: Merck Patent GmbH, Darmstadt (DE)

(72) Inventors: Yuko Horiba, Kakegawa (JP); Hiroko Kuboki, Kakegawa (JP); Tatsuro Nagahara, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 189 days.

(21) Appl. No.: 17/604,168

(22) PCT Filed: Apr. 15, 2020

(86) PCT No.: PCT/EP2020/060533
§ 371 (c)(1),
(2) Date: Oct. 15, 2021

(87) PCT Pub. No.: WO2020/212389
PCT Pub. Date: Oct. 22, 2020

(65) Prior Publication Data
US 2022/0213415 A1     Jul. 7, 2022

(30) Foreign Application Priority Data
Apr. 19, 2019   (JP) ................. 2019-079906

(51) Int. Cl.
| C11D 7/50 | (2006.01) |
| C11D 11/00 | (2006.01) |
| C11D 1/66 | (2006.01) |
| C11D 3/20 | (2006.01) |
| C11D 3/30 | (2006.01) |
| H01L 21/02 | (2006.01) |

(52) U.S. Cl.
CPC ............ *C11D 11/0047* (2013.01); *C11D 1/66* (2013.01); *C11D 3/2072* (2013.01); *C11D 3/30* (2013.01); *H01L 21/0206* (2013.01)

(58) Field of Classification Search
CPC .................................................. C11D 11/0047
USPC ........................................................ 510/175
See application file for complete search history.

(56) References Cited

U.S. PATENT DOCUMENTS

| 2019/0113848 A1 | 4/2019 | Wang et al. |
| 2019/0189426 A1* | 6/2019 | Thorum .................... B08B 3/08 |
| 2020/0135503 A1 | 4/2020 | Sasaki |

FOREIGN PATENT DOCUMENTS

| JP | 2013-042093 A | 2/2013 |
| JP | 2013-042094 A | 2/2013 |
| JP | 2015-050414 A | 3/2015 |
| JP | 2017-076817 A | 4/2017 |
| JP | 2018-139331 A | 9/2018 |
| JP | 2020-010015 A | 1/2020 |

(Continued)

OTHER PUBLICATIONS

International Search Report and Written Opinion received for PCT Patent Application No. PCT/EP20/060533, dated Jul. 28, 2020, 9 pages.

*Primary Examiner* — Gregory E Webb
(74) *Attorney, Agent, or Firm* — Faegre Drinker Biddle & Reath LLP

(57) ABSTRACT

To provide a substrate pattern filling composition capable of suppressing pattern collapse and a method for using the same. A substrate pattern filling composition comprising a first solute (A), a second a solute (B) and a solvent (C), and a method for using the same.

20 Claims, 1 Drawing Sheet

(56) References Cited

FOREIGN PATENT DOCUMENTS

WO      2017/174476 A1    10/2017
WO      2019/021664 A1    1/2019

\* cited by examiner

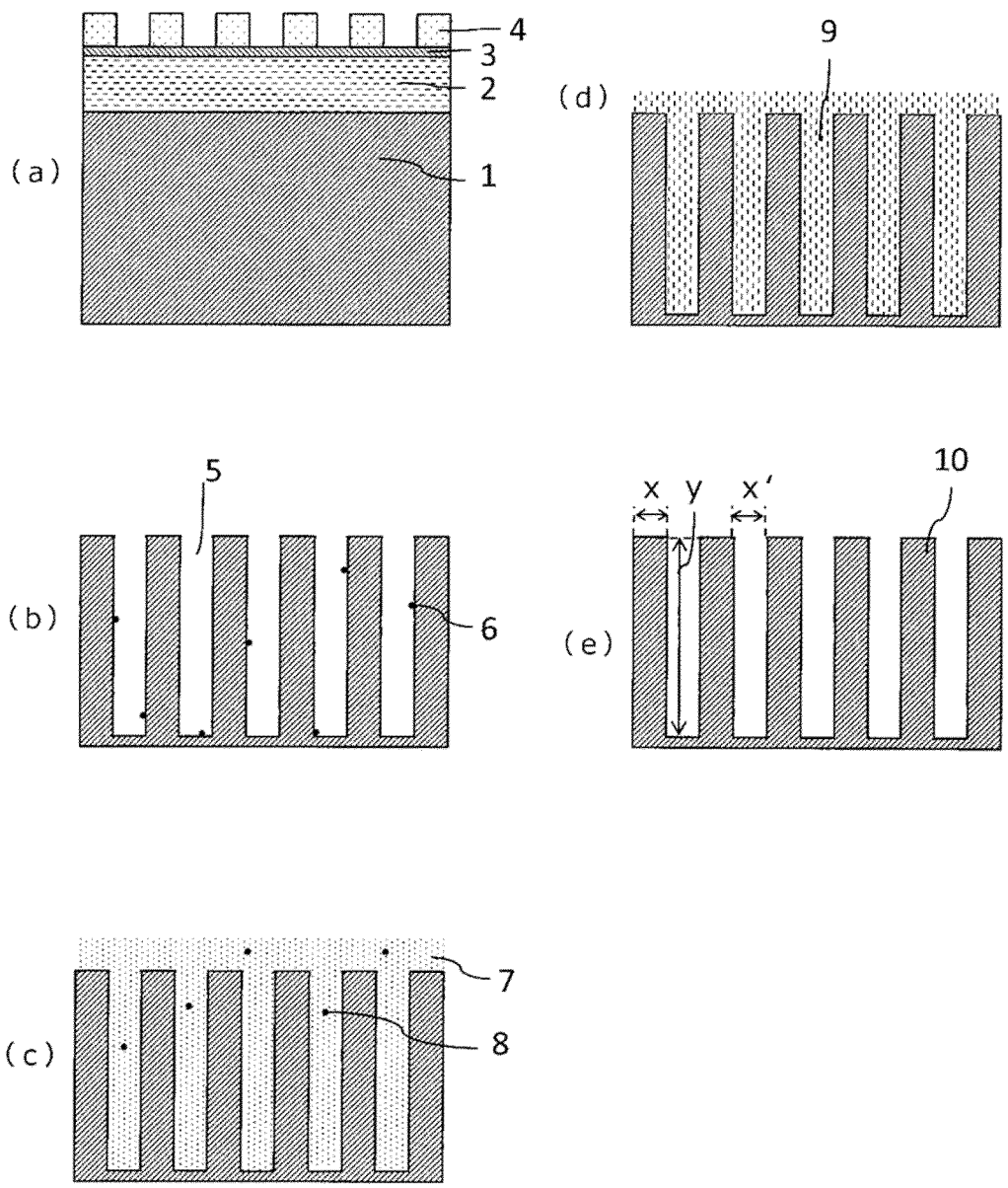

SUBSTRATE PATTERN FILLING COMPOSITION AND USE OF THE SAME

CROSS-REFERENCE TO RELATED APPLICATIONS

This application is a national stage application (under 35 U.S.C. § 371) of PCT/EP2020/060533, filed Apr. 15, 2020, which claims benefit of Japanese Application No. 2019-079906, filed Apr. 19, 2019, both of which are incorporated herein by reference in their entirety.

BACKGROUND OF THE INVENTION

Technical Field

The present invention relates to a substrate pattern filling composition and use of the same.

Background Art

In the manufacture of devices (electronic parts) such as semiconductor devices and liquid crystal display devices, a process for forming a fine uneven pattern on a wafer surface by film formation, lithography, etching, etc. and then cleaning the wafer surface is known. Due to the needs for higher integration of LSI, devices tend to be micronized, and there are needs for making width of the uneven pattern as described above narrower and making the aspect ratio higher. For cleaning the wafer surface on which the uneven pattern is formed, a technique for removing contaminants by supplying a cleaning liquid such as deionized water (DIW) or organic solvent is known. However, if the uneven pattern is very fine, there is a problem that pattern collapse occurs due to the surface tension and capillary action of the cleaning liquid during the drying process after removing the contaminants.

Under such circumstances, there is an attempt to clean the pattern while preventing the pattern collapse by replacing the cleaning liquid or the like with a filling treatment agent containing a sublimable substance and sublimating the sublimable substance. Patent Document 1 provides a technique for dropping on the uneven pattern a filling treatment agent comprising a sublimable substance once heated and melted, thereby replacing with a cleaning liquid, and cooling the filling treatment agent to make the sublimable substance deposited on the uneven pattern. Patent Document 2 provides a technique for lowering solubility of a sublimable substance in a solvent by cooling or the like to coagulate, and removing it by sublimation. Patent Document 3 provides a pattern forming method using a gap filling compound.

PRIOR ART DOCUMENTS

Patent Documents

[Patent document 1] JP-A 2013-42094
[Patent document 2] WO 2019/021664 [Patent document 3] WO 2017/174476

Non-Patent Document

[Non-patent Document 1] Toshiba Review Vol. 59 No. 8 (2004), pp. 22-25

SUMMARY OF THE INVENTION

Problems to be Solved by the Invention

The present inventors considered that there are one or more problems still need improvements. These include, for example, the followings: the substrate pattern cannot be cleaned cleanly; the pattern collapse occurs during cleaning of the substrate pattern; the fine substrate pattern cannot be filled; the film cannot be formed on the fine substrate pattern; heating and/or pressure reduction are needed to remove the film; the film cannot be removed from the substrate pattern by vaporization of the solute in the composition; it is difficult to make the solvent vaporized first and then the solute vaporized stepwise; the amount of the solute that remains in the substrate pattern after removal is large; solubility of the solid component in the solvent is low; the step for removing the film from the process of cleaning the substrate pattern is complicated; there is a damage to other layers and structures around the substrate pattern during substrate pattern cleaning; the yield is poor; and the composition stability is low.

The present invention has been made based on the technical background as described above, and provide a substrate pattern filling composition comprising a first solute (A), a second solute (B) and a solvent (C), and a method for using the same.

Means for Solving the Problems

The substrate pattern filling composition according to the present invention comprises a first solute (A), a second solute (B) and a solvent (C). The first solute (A) comprises at least any one of an amino group, a hydroxy group or a carbonyl group. Provided that the first solute has at most one hydroxy group per molecule. The second solute (B) comprises at least any one of an amino group, a hydroxy group or a carbonyl group. Provided that the second solute has at most one hydroxy group per molecule. The first solute (A) and the second solute (B) are different substances.

In the preferable embodiment of the composition according to the present invention, $bp_A$, $bp_B$ and $bp_C$, which are the boiling points under 1 atm respectively of the first solute (A), the second solute (B) and the solvent (C), satisfy $bp_A > bp_B > bp_C$.

The present specification provides a method for manufacturing a device comprising filling the composition according to the present invention in a substrate pattern to form a film and vaporizing the film to remove it.

Effects of the Invention

Using the substrate pattern filling composition of the present invention, it is possible to desire one or more of the following effects.

It is possible to cleanly clean the substrate pattern; it is possible to suppress pattern collapse during cleaning of the substrate pattern; it is possible to fill the fine substrate pattern; it is possible to form the film on the fine substrate pattern; it is possible to form the film without heating; it is possible to remove the film without heating and/or pressure reduction; it is possible to remove the film from the substrate pattern by vaporization of the solute in the composition; it is possible to suppress the collapse of the substrate pattern by vaporizing the solvent first and then vaporizing the solute stepwise; it is possible to reduce the amount of solute that remains in the substrate pattern after removal; it is possible to obtain the composition having good solubility of the solid components in the solvent; it is possible to reduce the steps for removing the film from the process of cleaning the substrate pattern; it is possible to reduce a damage to other layers and structures around the substrate pattern; the yield is good; and the composition stability is good.

BRIEF DESCRIPTION OF THE DRAWINGS

FIG. 1 has explanatory drawings for the method for forming a pattern according to the present invention.

DETAILED DESCRIPTION OF THE INVENTION

Mode for Carrying Out the Invention

Embodiments of the present invention are described below in detail.

Definitions

Unless otherwise specified in the present specification, the definitions and examples described in this paragraph are followed.

The singular form includes the plural form and "one" or "that" means "at least one". An element of a concept can be expressed by a plurality of species, and when the amount (for example, mass % or mol %) is described, it means sum of the plurality of species.

"And/or" includes a combination of all elements and also includes single use of the element.

When a numerical range is indicated using "to" or "-", it includes both endpoints and units thereof are common. For example, 5 to 25 mol % means 5 mol % or more and 25 mol % or less.

The descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

When polymer has a plural types of repeating units, these repeating units copolymerize. These copolymerization may be any of alternating copolymerization, random copolymerization, block copolymerization, graft copolymerization, or a mixture thereof. When polymer or resin is represented by a structural formula, n, m or the like that is attached next to parentheses indicate the number of repetitions.

Celsius is used as the temperature unit. For example, 20 degrees means 20 degrees Celsius.

The additive refers to a compound itself having a function thereof (for example, in the case of a base generator, the compound itself that generates a base). An aspect in which the compound is dissolved or dispersed in a solvent and added to the composition is also possible. As one embodiment of the present invention, it is preferable that such a solvent is contained in the composition according to the present invention as the solvent (C) or an other component.

Substrate Pattern Filling Composition

The substrate pattern filling composition according to the present invention comprises a certain first solute (A), a second solute (B) and a solvent (C). Furthermore, it comprises other components, if needed.

In the present invention, the substrate pattern means a pattern formed by processing a substrate, and does not include a pattern formed from an other film or layer on the substrate. For example, an aspect in which a resist pattern is formed on a bare wafer is not included in the substrate pattern of the present invention. The substrate pattern filling composition means a composition that is filled (being overflowed is accepted) between the patterns of a substrate pattern, and an aspect in which a film is formed after that is more preferable.

Each component is described below.

First Solute (A) and Second Solute (B)

The first solute (A) comprises at least any one of an amino group, a hydroxy group or a carbonyl group. Provided that the first solute has at most one hydroxy group per molecule. The second solute (B) comprises at least any one of an amino group, a hydroxy group or a carbonyl group. Provided that the second solute has at most one hydroxy group per molecule. The first solute (A) and the second solute (B) are different substances.

Preferably, the first solute (A) and/or the second solute (B) each independently comprises a 5-membered or 6-membered hydrocarbon ring or heterocyclic ring. As an aspect of the present invention, when the film formed from the substrate pattern filling composition is later vaporized, it is preferable that the second solute (B) vaporizes prior to the first solute (A).

As an aspect of the present invention, the substrate pattern filling composition according to the present invention is filled in a substrate pattern to form a film. It is preferable that the solvent (C) is vaporized first, the solid components form a film, and then the solid components are vaporized to remove the film. It is more preferable that the first solute (A) and the second solute (B) are vaporized independently as the solid components. A preferred aspect of the vaporization is sublimation. Preferably, the sublimation is that a portion of a solid component changes directly from the solid phase to the gas phase. More preferably, the sublimation is that substantially all of a solid component changes directly from the solid phase to the gas phase. Further, as another embodiment, the first solute (A) and/or the second solute (B) are substances having a sublimation point that each changes from the solid phase to the gas phase at room temperature without passing through the liquid phase. In another preferable embodiment, the first solute (A) and/or the second solute (B) can be a substance that changes from the solid phase to the gas phase through the liquid phase when heated at normal pressure, has a melting point, and gradually sublimates below the melting point.

Preferably, when removing the film formed from the substrate pattern filling composition, heating and/or pressure reduction are not performed. The heating referred to here is more preferably 70° C. or higher, further preferably 80° C. or higher, further more preferably 90° C. or higher, and the upper limit is more preferably 200° C. or lower, further preferably 170° C. or lower, further more preferably 150° C. or lower. The reduced pressure referred to here is more preferably 80 kPa or lower, further preferably 50 kPa or less, further more preferably 20 kPa or lower, and the lower limit is more preferably 1 kPa or higher, further preferably 5 kPa or higher, further more preferably 10 kPa or higher. Further, it is also an advantage of the present invention that when the above-described film is removed in the present invention, the cooling step as described in Patent Document 1 is not essential. As another aspect of the present invention, it is also an advantage of the present invention that gas blowing is not essential for removal of the film. The gas referred here includes air, Ar and nitrogen gas, and for example, using a gas of which humidity and oxygen concentration are reduced is included.

In order to make the substrate pattern clean, from the viewpoint of reducing the amount remaining in the substrate pattern, it is desirable that the first solute (A) and the second solute (B) are substances that are easily vaporized. In order to further reduce the remaining amount of solid components having such characteristics, it is also possible to add a heating step. In one embodiment of the present invention, it is possible to heat when the film formed from the substrate pattern filling composition is removed, and the conditions therefor can be 35 to 150° C. (more preferably 35 to 120° C., further preferably 40 to 110° C., and further more preferably 40 to 100° C.) and 10 to 180 seconds (more preferably 10 to 120 seconds, and further preferably 10 to 90 seconds).

In one aspect of the present invention, the amino group and/or the carbonyl group in the first solute (A) and/or the second solute (B) are each independently a part of the ring in the hydrocarbon ring or the heterocyclic ring, and the hydroxy group is directly added to the ring in the hydrocarbon ring or the heterocyclic ring. That is, the compound having a carboxyl group does not fall under the first solute (A) and the second solute (B) in this embodiment. Preferably, the first solute (A) and/or the second solute (B) each independently has a cage-shaped steric mother structure. As an example of the compound having the cage-shaped steric structure, 1,4-diazabiccyclo[2.2.2]-octane (hereinafter, DABCO) is included. The advantage is that the bulkiness can be suppressed as compared with its molecular weight. As another aspect, an aspect in which each independently in the first solute (A) and/or the second solute (B) the amino group is directly added to the ring is also suitable. For example, 1-adamantanamine has a cage-shaped steric mother structure, and the amino group is added not to a part of the ring but directly to the ring.

In a preferred aspect of the present invention, the first solute (A) and/or the second solute (B) each independently has 1 to 5 (more preferably 1 to 4, further preferably 2 to 4) amino groups, 1 to 3 (more preferably 1 to 2) carbonyl groups, and/or one hydroxy group per molecule. The amino group also includes an aspect in which bonding hands of a nitrogen atom are used for a double bond as in C=N— (imino group). The number of amino groups is counted by the number of nitrogen atoms present in one molecule. An embodiment having any one kind of an amino group, a carbonyl group and a hydroxy group in one molecule is a preferred aspect of the present invention. As another aspect, it is also preferable to have a carbonyl group and an amino group in one molecule.

As one aspect of the present invention, the molecular weight of the first solute (A) and/or the second solute (B) are each independently 80 to 300 (preferably 90 to 200). Although not to be bound by theory, it can be considered that if the molecular weight is too large, energy is required at the time of vaporization, which is not suitable for the method according to the present invention.

As a preferred aspect of the present invention, the sum of the mass of the first solute (A) and the mass of the second solute (B) is 1 to 40 mass % (more preferably 1 to 30 mass %, and further preferably 2 to 20 mass %) based on the mass of the substrate pattern filling composition. Although not to be bound by theory, it is considered that if the amount of the solute is too small, film formation becomes difficult and the effect of suppressing the collapse of the substrate pattern is reduced.

Preferably, the mass ratio of the first solute(A):the second solute (B) is 99:1 to 1:99 (more preferably 95:5 to 5:95, further preferably 90:10 to 10:90, and further more preferably 80:20 to 20:80). In another preferred aspect of the present invention, the mass ratio of the second solute (B) to the first solute (A) is 0.5 to 20 (more preferably 1 to 20, and further preferably 5 to 20).

As one aspect of the present invention, the first solute (A) is represented by the formula (A):

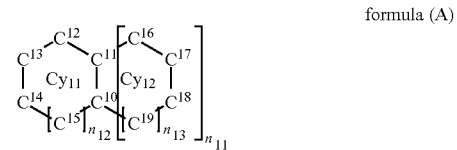

formula (A)

wherein, $Cy_{11}$ and $Cy_{12}$ are each independently a saturated or unsaturated hydrocarbon ring or a heterocyclic ring. Preferably both $Cy_{11}$ and $Cy_{12}$ are saturated or unsaturated hydrocarbon rings or heterocyclic rings, and more preferably both $Cy_{11}$ and $Cy_{12}$ are saturated hydrocarbon rings or heterocyclic rings. The heterocyclic ring mentioned here can be a heterocyclic ring resulted by replacing $C^{n1}$ that forms the ring.

$C^{n1}$ is each carbon, n1 is an integer of 10 to 19 (that is, $C^{10}$, $C^{11}$, ... $C^{19}$). The remaining bonding hand of $C^{n1}$ is bonded with H.

$C^{n1}$ can be each independently replaced with —$C^{n1}R_{n1}$—, —$C^{n1}R_{n1}R_{n1'}$—, —$C^{n1}$(OH)—, —$C^{n1}$(=O)—, —$N^{n1}H$— and/or —$N^{n1}R_{n1}$—. Provided that at least one $C^{n1}$ is replaced with at least any one of the above. It goes without saying that elements that do not exist are excluded from this proviso. For example, in the case of $n_{11}=n_{12}=0$, at least any one of $C^{10}$ to $C^{14}$ is replaced. It is preferred that adjacent $C^{n1}$ are not replaced at the same time.

$R_{n1}$ and $R_{n1'}$ are each independently $C_{1-5}$ alkyl (preferably $C_{1-4}$, more preferably $C_{1-3}$), —$NH_2$ and/or $C_{1-5}$ aminoalkyl (preferably $C_{1-4}$, more preferably $C_{1-3}$, and further preferably $C^1$), and $R_{n1}$ and/or $R_{n1'}$ can be combined with another $R_{n1}$, $R_{n1'}$ and/or $C^{n1}$ to form a ring. An aspect in which $R_{n1}$ and $R_{n1'}$ are combined with another $R_{n1}$, $R_{n1'}$ and/or $C^{n1}$ to form a ring is preferred.

$n_{11}$, $n_{12}$ and $n_{13}$ are each independently 0 or 1. Preferably, $n_{11}=0$. Preferably, $n_{12}=1$. Preferably, $n_{13}=1$.

As one aspect of the present invention, the second solute (B) is represented by the formula (B):

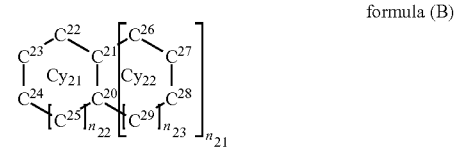

formula (B)

The definitions, examples, and descriptions of $Cy_{21}$, $Cy_{22}$, $R_{n2}$, $R_{n2'}$, $n_{21}$, $n_{22}$ and $n_{23}$ are each independently the same as those of $Cy_{11}$, $Cy_{12}$, $R_{n1}$, $R_{n1'}$, $n_{11}$, $n_{12}$ and $n_{13}$.

The definition, example and description of $C^{n2}$ are each independently the same as those of $C^{n1}$. $n_2$ is an integer of 20 to 29 (that is, $C^{20}$, $C^{21}$, ... $C^{29}$). Examples and descriptions of n2 (20 to 29) each independently correspond to those of n1 (10 to 19).

As one aspect of the present invention, the following compound can be represented by the formula (A). In this case, $Cy_{11}$ is a saturated six-membered hydrocarbon ring, and $n_{11}=0$ and $n_{12}=1$. $C^{12}$ is replaced with —$C^{12}R_{12}R_{12'}$—.

$R_{12}$ is methyl ($C_1$ alkyl) and $R_{12}$ is isopropyl ($C_3$ alkyl). $R_{12'}$ is combined with $C^{15}$ to form a ring. $C^{13}$ is replaced with —$C^{13}$(=O)—, and $C^{14}$ is replaced with —$C^{14}$(=O)—. The following compound has two carbonyl groups per molecule. As a whole, the following compound has a cage-shaped steric mother structure.

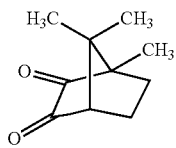

As one aspect of the present invention, the following compound can be represented by the formula (B). In this case, $Cy_{21}$ is a saturated six-membered hydrocarbon ring, and $n_{21}=0$ and $n_{22}=1$. $C^{20}$ is replaced with —$N^{20}R_{20}$—, $C^{22}$ is replaced with —$N^{22}R_{22}$—, and $C^{24}$ is replaced with —$N^{24}R_{24}$—. $R_{20}$ is aminomethyl ($C_1$), and $R_{22}$ and $R_{24}$ are methyl ($C_1$). $R_{20}$, $R_{22}$ and $R_{24}$ are bonded to form a ring. The following compound has 4 amino groups per molecule. As a whole, the following compound has a cage-shaped steric mother structure.

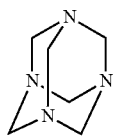

As one aspect of the present invention, the following compound can be represented by the formula (A). In this case, $Cy_{11}$ is a saturated six-membered hydrocarbon ring (which becomes a heterocyclic ring by the subsequent replacement). $n_{11}=0$ and $n_{12}=1$. $C^{12}$ is replaced with —$C^{12}R_{12}R_{12'}$—, $C^{14}$ is replaced with —$C^{14}R_{14}$—, and $C^{10}$ is replaced with —$C^{10}R_{10}$—. $R_{12}$ is —$NH_2$, $R_{12'}$ is ethyl ($C_2$), and $R_{14}$ and $R_{10}$ are methyl ($C_1$). $R_{12}$, $R_{14}$ and $R_{10}$ are bonded to form a ring. The following compound has one amino group per molecule. As a whole, the following compound has a cage-shaped steric mother structure.

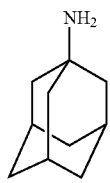

As one aspect of the present invention, the following compound can be represented by the formula (B). In this case, $Cy_{21}$ is an unsaturated six-membered hydrocarbon ring (phenyl), and $Cy_{22}$ is a saturated five-membered hydrocarbon ring (which becomes a heterocyclic ring by the subsequent replacement). $n_{21}=n_{22}=1$ and $n_{23}=0$. $C^{26}$ is replaced with —$C^{26}$(=O)—, and $C^{28}$ is replaced with —$C^{28}$(=O)—. The following compound has two carbonyl groups per molecule. As a whole, the following compound can be planarly described of its structural formula and has no cage-shaped steric mother structure.

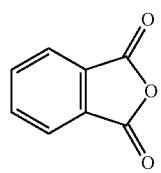 [SMILES: O=C1OC(=O)c2ccccc21]

Although the scope of the present invention is not limited, exemplified embodiments of the first solute (A) and/or the second solute (B) respectively include the followings. That is, these are each independently any of phthalic anhydride, caffeine, melamine, 1,4-benzoquinone, camphor, hexamethylenetetramine, hexahydro-1,3,5-trimethyl-1,3,5-triazine, 1-adamantanol, 1,4-diazabicyclo[2.2.2]octane, borneol, (−)-borneol, (+)-isoborneol, 1,2-cyclohexanedione, 1,3-cyclohexanedione, 1,4-cyclohexanedione, 3-methyl-1,2-cyclopentanedione, (+)-camphorquinone, (−)-camphorquinone, (+)-camphorquinone or 1-adamantaneamine.

Although the scope of the present invention is not limited, exemplified embodiments of the first solute (A) and/or the second solute (B) include the followings:

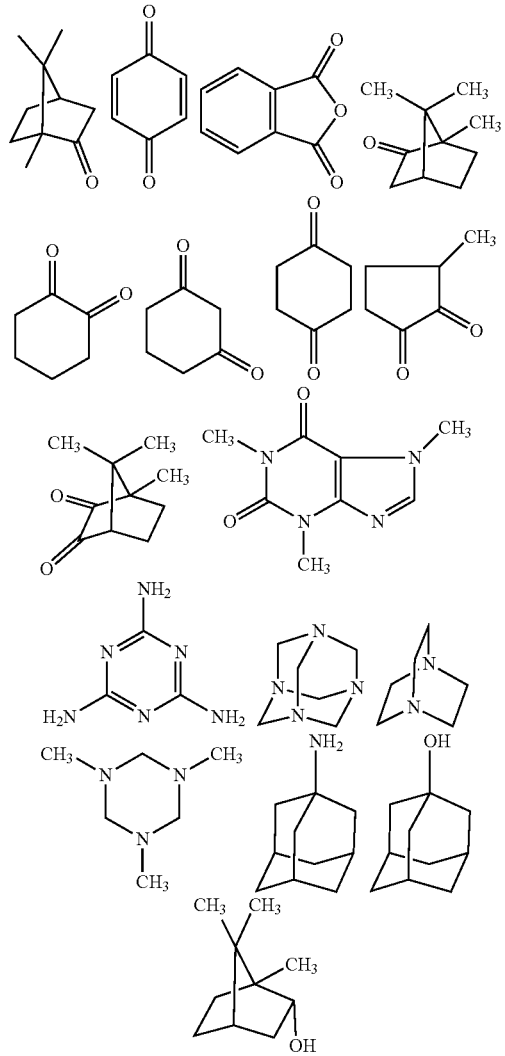

The first solute (A) consists of a single type of compound and is not expressed by a plurality of types. For example, an aspect in which phthalic anhydride and caffeine are simultaneously contained in the composition as the first solute (A) is outside the scope of the present invention. In addition, an aspect containing in the composition, phthalic anhydride as the first solute (A) and caffeine as the second solute (B), can be included in the scope of the composition of the present invention.

However, the optical isomers among those included in the exemplified embodiments can be used as a mixture. The same applies to the second solute (B) as well as the third solute (D) and the fourth solute (E), which are described later.

The first solute (A) and/or the second solute (B) do not exclude being mixed with trace impurities. For example, when the first solute (A) is phthalic anhydride, 2 mass % or less (preferably 1 mass % or less, more preferably 0.1 mass % or less, and further preferably 0.01 mass % or less) of impurities (other than phthalic anhydride) is accepted to be present, based on the total amount of the first solute (A).

Solvent (C)

The substrate pattern filling composition according to the present invention comprises a solvent (C). It is preferred that the solvent (C) comprises an organic solvent. As one embodiment of the present invention, the solvent (C) has volatility. It is preferred that the solvent (C) is more easily vaporized as compared with water. As one aspect of the present invention, a solvent that is vaporized by spin drying is preferable. For example, the solvent (C) has a boiling point at 1 atm of preferably 50 to 200° C., more preferably 60 to 170° C., and further preferably 70 to 150° C. It is allowable that the solvent (C) contains a small amount of pure water. It is a preferred embodiment of the present invention that no pure water is contained (0 mass %). In the present specification, the pure water is preferably deionized water.

As a preferred aspect of the present invention, components (including additives) contained in the substrate pattern filling composition are dissolved in the solvent (C). The substrate pattern filling composition taking this aspect is considered to have good embedding properties and/or film uniformity.

Examples of the organic solvent include alcohols such as methanol (MeOH), ethanol (EtOH) and isopropanol (IPA); alkanes such as hexane, heptane and octane; ethers such as ethyl butyl ether, dibutyl ether, and tetrahydrofuran (THF); lactic acid esters such as methyl lactate and ethyl lactate (EL); aromatic hydrocarbons such as benzene, toluene and xylene; ketones such as acetone, methyl ethyl ketone, methyl isobutyl ketone, 2-heptanone, cyclopentanone and cyclohexanone; amides such as N,N-dimethylacetamide and N-methylpyrrolidone; and lactones such as γ-butyrolactone. The above ethers can include, besides the above-described, ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether (PGME) and propylene glycol monoethyl ether (PGEE); and propylene glycol monoalkyl ether acetates such as propylene glycol monomethyl ether acetate (PGMEA) and propylene glycol monoethyl ether acetate.

These organic solvents can be used alone or in a mixture of any two or more of these.

As a preferred aspect, the organic solvent contained in the solvent (C) is selected from MeOH, EtOH, IPA, THF, PGEE, benzene, acetone, methyl isobutyl ketone, cyclopentanone, cyclohexanone, and any combination thereof. The organic solvent contained in the solvent (C) is selected more preferably from MeOH, EtOH, IPA, PGEE, acetone and any combination thereof, and further preferably from MeOH, EtOH, IPA and PGEE. When the organic solvent is used as a combination of two kinds, the volume ratio is preferably 20:80 to 80:20, more preferably 30:70 to 70:30, and further preferably 40:60 to 60:40.

As one aspect of the present invention, the mass of the solvent (C) is 30 to 99 mass % (preferably 50 to 95 mass %, more preferably 80 to 95 mass %, further preferably 85 to 95 mass %) based on the mass of the substrate pattern filling composition.

In one aspect of the present invention, $bp_A$, $bp_B$ and $bp_C$, which are the boiling points under 1 atm respectively of the first solute (A), the second solute (B) and the solvent (C), satisfy $bp_A>bp_B>bp_C$. Further, $vp_A$, $vp_B$ and $vp_C$, which are the saturated vapor pressures at 25° C. under 1 atm respectively of the first solute (A), the second solute (B) and the solvent (C), satisfy $vp_A<vp_B<vp_C$. Although not to be bound by theory, it is considered that using a composition that satisfies such relations, when the composition is applied to the substrate pattern, the solvent (C) is volatilized to form a film made of solid components, and then the second solute (B) and the first solute (A) are vaporized in this order. In addition, these state changes mean the tendency as a whole, and it is not necessary to be completely separated and a part thereof can be overlapped. An aspect in which the substance first vaporized takes heat of vaporization and this enable stepwise vaporization as a whole is also possible. It is considered that the second solute (B) is first vaporized from inside the film, thereby avoiding rapid disappearance of the film and reducing interaction with the substrate pattern. Further, it is considered that in the film after the second solute (B) is vaporized, a low-density film of the first solute (A) remains. It is considered that since this low-density film has a low density, the force applied to the substrate pattern during vaporization is reduced. Therefore, it is preferably a component that vaporizes when left to stand for 180 seconds at normal temperature (20 to 27° C., preferably 23 to 25° C.).

$bp_A$ and/or $bp_B$ are preferably 100 to 300° C., and more preferably 150 to 295° C. $bp_C$ is preferably 50 to 170° C., more preferably 50 to 150° C., and further preferably 60 to 140° C.

Third Solute (D) and (E) Fourth Solute

The substrate pattern filling composition according to the present invention can further comprises a third solute (D). Also, it can further comprise a fourth solute (E). These remain as solid components in the film formed from the substrate pattern filling composition filled in the substrate pattern. They each independently vaporize from this film.

Exemplified embodiments of the third solute (D) and the fourth solute (E) are the same as the exemplified embodiments of the first solute (A) and/or the second solute (B).

$bp_D$ and $bp_E$, which are the boiling points under 1 atm respectively of the third solute (D) and the fourth solute (E), and $vp_D$ and $vp_E$, which are the saturated vapor pressures at 25° C. and under 1 atm respectively of the third solute (D) and the fourth solute (E), preferably satisfy $bp_C<bp_E<bp_D<bp_B<bp_A$, and it is also preferable to satisfy $vp_A<vp_B<vp_D<vp_E<vp_C$. Although not to be bound by theory, it is considered that by satisfying such relations, the fourth solute (E), the third solute (D), the second solute (B)

and the first solute (A) are vaporized in this order from the film formed from the composition.

Preferably, the mass ratio of the first solute(A):the third solute (D) is 99:1 to 1:99 (more preferably 95:5 to 5:95, further preferably 90:10 to 10:90, and further more preferably 80:20 to 20:80). Preferably, the mass ratio of the first solute(A):the fourth solute (E) is 99:1 to 1:99 (more preferably 95:5 to 5:95, further preferably 90:10 to 10:90, and further more preferably 80:20 to 20:80).

Other Additive (F)

The substrate pattern filling composition according to the present invention can further comprise an other additive (F). The other additive (F) comprises a surfactant, an antibacterial agent, a bactericidal agent, an antiseptic agent, an antifungal agent, an acid, and/or a base. The other additive (F) is preferably highly volatile. It is desirable that the other additive (F) is vaporized at the time of vaporization of the first solute (A) and the second solute (B), which are solid components, in the process or vaporized before and after their vaporization.

Compared with the sum of the mass of the first solute (A) and the mass of the second solute (B), the other additive (F) is 0 to 20 mass % (preferably 0 to 10 mass %, and more preferably 0 to 5 mass %). It is also a preferred embodiment of the present invention that no other additive (F) is contained (0 mass %).

Surfactants that can be contained in the other additive (F) can be expected to improve coating properties. As the surfactant, any one can be used. Examples of the surfactant that can be used in the present invention include an anionic surfactant (F-1), a cationic surfactant (F-2) or a nonionic surfactant (F-3), and more particularly (F-1): alkyl sulfonate, alkyl benzene sulfonic acid and alkyl benzene sulfonate, (F-2): lauryl pyridinium chloride and lauryl methyl ammonium chloride, and (F-3): polyoxyethylene octyl ether, polyoxyethylene lauryl ether and polyoxyethylene acetylenic glycol ether are preferred. These surfactants, for example, nonionic alkyl ether-based surfactant manufactured by Nippon Nyukazai etc. as an example of nonionic surfactant, are commercially available.

Further, the substrate pattern filling composition according to the present invention can comprise an antibacterial agent, a bactericidal agent, an antiseptic agent, and/or an antifungal agent as the other additive (F). These agents are used to prevent bacteria or fungi from propagating in an aged substrate pattern filling composition. Examples of these include alcohols such as phenoxyethanol and isothiazolone. Bestcide (trade name) commercially available from Nippon Soda Co., Ltd. is an effective antiseptic agent, antifungal agent and bactericidal agent. Typically, these agents do not affect the performance of the substrate pattern filling composition and the content thereof is usually 1 mass % or less, preferably 0.1 mass % or less, and more preferably 0.001 mass % or less, based on the total mass of the substrate pattern filling composition.

Further, the substrate pattern filling composition according to the present invention can comprise an acid and/or a base as the other additive (F). The acid or base is used to adjust pH of the treatment liquid or improve solubility of each component. Although following is described to ensure clarity, in one substrate pattern filling composition, the other additive (F) is a compound different from the components (A) to (E).

The acid or base used can be freely selected within a range not impairing the effects of the present invention, and examples thereof include carboxylic acids, amines and ammonium salts. These include fatty acids, aromatic carboxylic acids, primary amines, secondary amines, tertiary amines, ammonium compounds, and these can be substituted with any substituent. More particularly, formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine, and tetramethyl-ammonium are included.

Method for Forming a Substrate Pattern

The method for forming a substrate pattern according to one embodiment of the present invention is described below with reference to the drawings. The method for forming a substrate pattern can be freely selected from known methods such as dry etching. Such a method for forming a substrate pattern is also described, for example, in Non-Patent Document 1 etc.

In the method for forming a substrate pattern of the present invention, various pretreatments can be combined.

FIG. 1(a) shows a state in which a coated carbon film (also referred to as "coated C film" or "Spin On Carbon film") layer 2 is formed on a substrate 1, a silicon-containing anti-reflective coating (also referred to as "Si-ARC") layer 3 is formed thereon, and a resist pattern 4 is formed thereon.

The substrate used is not particularly limited, and examples thereof include a semiconductor substrate (for example, a silicon wafer etc.), a glass substrate of LCD and PDP etc., and the like. A conductive film, a wiring, a semiconductor, or the like can be formed on the substrate.

The coated carbon film can be formed by applying with a conventionally known method such as spin coating, and performing pre-baking. Alternatively, the film can be formed also by CVD (chemical vapor deposition) method or ALD (atomic layer deposition) method.

The silicon-containing anti-reflective coating layer can be formed by applying with spin coating, and performing pre-baking. By such a silicon-containing anti-reflective coating layer, the sectional shape and the exposure margin can be improved. Further, since the silicon-containing anti-reflective coating layer is used as an etching mask, for example, one having etching resistance is preferable.

The resist pattern can be formed by combining known methods. For example, it is described in Patent Document 3.

The process of etching the underlying film (interlayer) using the resist pattern as a mask and using the resultant as a mask can be performed stepwise, or the substrate can be directly etched using the resist pattern as a mask. The etching of the interlayer can be performed by either of dry etching or wet etching.

FIG. 1(b) shows a state in which the substrate is subjected to dry etching to form a gap 5. The gas type for dry etching is not particularly limited, but a chlorofluorocarbon-based gas is usually used. After dry etching, a residue 6 (debris) remains between the patterns.

FIG. 1(c) shows a state in which the substrate pattern is cleaned with a cleaning liquid 7. As the method for applying the cleaning liquid 7, known methods can be used, and examples thereof include coating, dropping and immersing. Any combination of these can be used. The residue 8 is removed by the cleaning process.

FIG. 1(d) shows a state in which the substrate pattern filling composition 9 of the present invention is filled in the substrate pattern. The composition of the present invention is applied (preferably coated, dropped, or immersed) in a state that the liquid of FIG. 1(c) is remained. The coating method is not particularly limited, and coating can be performed, for example, by a method of dropping the composition on the surface of the substrate to spread it while rotating the substrate at 1 to 500 rpm, a method of dropping the composition on the surface of the substrate while the substrate is stationary and then rotating the substrate at 1 to 500 rpm to spread the composition, a method of immersing the substrate, or supplying by spraying or blasting. Among these, the method of dropping the composition on the surface of the substrate to spread it while rotating the substrate at 1 to 500 rpm, and the method of dropping the composition on the surface of the substrate while the substrate is stationary and then rotating the substrate at 1 to 500 rpm to spread the composition are preferred. In this regard, at least a part of the above-described liquid is replaced, and the composition is filled in the substrate pattern. In order to sufficiently exhibit the effects of the present invention, it is preferable that the replacement is sufficiently performed.

After the above process, the substrate can be rotated at faster than 500 rpm and 5,000 rpm or less. By this rotation, the excess organic solvent and water in the present composition disappear from the substrate, but at least a part of the first solute (A) and the second solute (B) remains. It is considered that pattern collapse can be prevented because the composition does not all disappear from between the patterns.

Here, one embodiment of the present invention includes the following. In the method for forming a substrate pattern of the present invention, the previously formed substrate pattern is cleaned with a cleaning liquid before applying (preferably coating) the substrate pattern filling composition and the liquid present on the substrate can be replaced with the substrate pattern filling composition of the present invention. The previously formed substrate pattern is in a state before the cleaning treatment is performed, and a residue (debris or the like) sometimes remains on the pattern surface. The liquid present on the substrate is, for example, a cleaning liquid. The cleaning can be performed in multiple steps, and for example, after applying the cleaning liquid (acid, alkali, etc.) that dissolves and removes inorganic substances, a cleaning liquid (deionized water, organic solvent) that is highly compatible with the substrate pattern filling composition of the present invention can be applied. The replacement of the liquid present on the substrate means replacing the liquid present before the substrate pattern filling composition is applied. Preferably, the liquid remaining in the substrate pattern is sufficiently replaced.

FIG. 1(e) shows a state in which the filled composition is removed to form a pattern 10.

Removal of the composition can be performed by heating, decompression, air drying, standing, or a combination thereof. Any of these removal methods can be used as long as the pattern shape is not impaired. The heating time is not particularly limited, but is preferably 10 to 180 seconds, more preferably 10 to 120 seconds, and further preferably 10 to 90 seconds. The time of pressure reduction is not particularly limited, but is preferably 0.5 to 60 minutes, and more preferably 0.5 to 10 minutes. Conditions of the pressure reduction can be controlled using a desiccator or oil pump. Further, removal of the composition by air drying can be performed by holding the pattern in the airflow. In this regard, the airflow can be either due to positive pressure or due to negative pressure. In particular, an airflow can be generated by blowing gas. In such a case, the gas used is not particularly limited, and air or the like can be used; however, an inert gas is preferably used. In particular, it is preferable to use argon gas, nitrogen gas, or the like. The airflow velocity is not particularly limited, and is appropriately selected so that removal of the composition is performed. In the above removal of the composition, the humidity of the gas forming the atmosphere or airflow is preferably low, and the humidity can be set, for example, 10% or less, preferably 5% or less, more preferably 1% or less, and particularly preferably 0.1% or less.

The method for forming a substrate pattern of the present invention can suppress the collapse ratio even with respect to a fine pattern. For example, a pillar (cylinder) whose middle part is thinner than the bottom part and/or the top part is easy to collapse, but even such a pillar pattern structure can be cleaned while suppressing the collapse ratio.

The pattern of the line space structure which is a wall structure is considered to be harder to collapse than the pillar pattern, but the collapse ratio can be further lowered using the method for forming a substrate pattern of the present invention.

Here, as shown in FIG. 1(e), the line width of the pattern formed on the substrate is x, and the length in the depth direction is y. The aspect ratio of the pattern is represented by y/x. In a pattern to which the present invention can be effectively applied, y is 0.01 to 6 µm or less, preferably 0.05 to 5 µm, and more preferably 0.1 to 3 µm. The aspect ratio is preferably 5 to 25, and more preferably 15 to 22.

Substrate

In the present invention, the substrate includes a semiconductor wafer, a glass substrate for a liquid crystal display device, a glass substrate for an organic EL display device, a glass substrate for a plasma display, a substrate for an optical disk, a substrate for a magnetic disk, a substrate for a magneto-optical disk, a glass substrate for a photomask, and a substrate for a solar cell. The substrate can be either a non-processed substrate (for example, a bare wafer) or a processed substrate (for example, a pattern substrate). The substrate can be configured by laminating a plurality of layers. Preferably, the surface of the substrate is a semiconductor. The semiconductor can be composed either of an oxide, a nitride, a metal or a combination of any of these. Further, the surface of the substrate is preferably selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TiN, TaN, $Si_3N_4$, NbN, Cu, Ta, W, Hf, and Al Device A device can be manufactured by further processing the substrate according to the present invention. As the device, a semiconductor device, a liquid crystal display device, an organic EL display device, a plasma display device, and a solar cell device are included. The device is preferably the semiconductor. Known methods can be used for these processing. After forming a device, if necessary, the substrate can be cut into chips, connected to a lead frame, and packaged with resin. An example of the packaged one is the semiconductor.

The present invention is described below with reference to various examples. The aspect of the present invention is not limited to these examples.

Preparation Example 1 of Example Composition 1

1-adamantanamine as the first solute and camphor as the second solute are added to an IPA solvent so that each is 10 mass %. The vessel is capped and stirring is performed overnight to obtain a solution. It can be visually confirmed that the solutes are dissolved. The solution is filtered through a filter having a pore size of 0.1 μm to obtain Example Composition 1.

Preparation Examples 2 to 21 of Example
Compositions 2 to 21, and Comparative Preparation
Examples 1 to 8 of Comparative Example
Compositions 1 to 8

Example Compositions 2 to 21 and Comparative Example Compositions 1 to 8 are prepared as in Preparation Example 1, except that the solutes, amount thereof or solvent are changed as shown in Table 1. As to each, it can be visually confirmed that the solutes are dissolved after stirring.

Evaluation of Sublimability

A 300 mm bare silicon wafer is put into a coater developer RF3 (SOKUDO). 10 cc of each composition is dropped on the wafer transferred to the coater cup and spin-coated at 1,500 rpm for 20 seconds. Thereafter, the wafer is left to stand in the coater cup and visually observed setting 120 seconds as the upper limit. The temperature in the coater cup is about 21 to 23° C.

Sublimability of each sample is evaluated according to the following evaluation criteria. The results are described in Table 1.

A: Although a film based on the solid components in the composition is formed, it is confirmed that the film vaporizes and disappears within 120 seconds.

B: Although a film based on the solid components in the composition is formed, it is confirmed that the film does not disappear even after 120 seconds.

The sample wafers evaluated as B are further heated (100° C. for 90 seconds) with a hot plate and visually observed. Sublimability is evaluated according to the following criteria.

B1: It is confirmed that the film disappears after heating.
B2: It is confirmed that the film does not disappear after heating and remains.

TABLE 1

|  |  | The first solute | The second solute | Solvent | Sublimability |
|---|---|---|---|---|---|
| Example | Composition 1 | 1-adamantanamine | camphor (10) | IPA | A |
|  | Composition 2 | 1-adamantanamine | camphor (9.5) | IPA | A |
|  | Composition 3 | DABCO (10) | 1,4-benzoquinone (10) | IPA | A |
|  | Composition 4 | 1-adamantanamine | 1,4-benzoquinone (10) | MeOH | A |
|  | Composition 5 | DABCO (10) | borneol (10) | IPA | A |
|  | Composition 6 | 1-adamantanamine | borneol (10) | IPA | A |
|  | Composition 7 | DABCO (10) | 1-adamantanamine | IPA | A |
|  | Composition 8 | 1-adamantanamine | 1-adamantanamine | IPA | A |
|  | Composition 9 | borneol (10) | camphor (10) | IPA | A |
|  | Composition 10 | DABCO (10) | 1-adamantanamine | IPA | A |
|  | Composition 11 | camphor (10) | 1,4-benzoquinone (10) | IPA | A |
|  | Composition 12 | DABCO (10) | camphor (10) | PGEE | A |
|  | Composition 13 | hexamethylenetetramine (10) | 1,4-benzoquinone (10) | EtOH | B1 |
|  | Composition 14 | hexamethylenetetramine (10) | borneol (10) | IPA | B1 |
|  | Composition 15 | hexamethylenetetramine (10) | 1-adamantanamine (10) | IPA | B1 |
|  | Composition 16 | 1-adamantanol (10) | camphor (10) | IPA | B1 |
|  | Composition 17 | 1-adamantanol (10) | 1,4-benzoquinone (10) | IPA | B1 |
|  | Composition 18 | 1-adamantanol (10) | 3-methyl-1,2-cyclopentanedione (10) | IPA | B1 |
|  | Composition 19 | DABCO (10) | hexamethylenetetramine (10) | IPA | B1 |
|  | Composition 20 | borneol (10) | 1-adamantanol (10) | IPA | B1 |
|  | Composition 21 | hexamethylenetetramine (10) | camphor (10) | PGEE | B1 |
| Comparative Example | Composition 1 | DABCO (20) | — | PGEE | A |
|  | Composition 2 | 1-adamantanamine | — | IPA | A |
|  | Composition 3 | borneol (20) | — | IPA | A |
|  | Composition 4 | 1-adamantanamine | — | EtOH | A |
|  | Composition 5 | 1,4-benzoquinone (20) | — | MeOH | A |
|  | Composition 6 | hexamethylenetetramine (20) | — | PGEE | B1 |
|  | Composition 7 | trimethylolethane (20) | — | IPA | B2 |
|  | Composition 8 | phthalic acid (20) | — | EtOH | B1 |

The FIGURES in parentheses in the above table mean mass % of the solute based on the whole composition.

Hereinafter, the compositions are divided into (Group A): those, of which sublimability is evaluated to be A and (Group B): those, of which sublimability is evaluated to be B (B1, B2), and they are evaluated.

(Group A) Evaluation of Remaining Film

The sample after the above evaluation of sublimability is used.

The film thickness on the wafer is measured with an ellipsometer M-2000 (J. A. Woollam). In the ellipsometer measurement, constructing a two-layer model in which the remaining film derived from the present test and the natural oxide film are overlapped, only film thickness of the remaining film is calculated.

dropped on the wafer and spin-coated at 1,000 rpm for 20 seconds. Immediately, the wafer is taken out and left on a laboratory desk in a clean room for about 120 seconds. The temperature of the clean room is controlled at normal temperature (about 23° C.).

After the above treatment, each wafer is observed from the upper surface with SEM (SU8200, Hitachi High-Technologies). The collapse ratio is calculated by dividing the area of the part where the pillar pattern is collapsed by the total area that is observed. The results are described in Table 2.

A: The collapse ratio is less than 5%.
B: The collapse ratio is 5% or more.
Total Evaluation The cases that the remaining film and the collapse ratio are both A are regarded as good. Others are regarded as insufficient. The results are described in Table 2.

TABLE 2

|  |  | The first solute | The second solute | Solvent | Remaining film | Collapse ratio | Total evaluation |
|---|---|---|---|---|---|---|---|
| Example | Composition 1 | 1-adamantanamine | camphor (10) | IPA | A | A | good |
|  | Composition 2 | 1-adamantanamine (0.5) | camphor (9.5) | IPA | A | A | good |
|  | Composition 3 | DABCO (10) | 1,4-benzoquinone (10) | IPA | A | A | good |
|  | Composition 4 | 1-adamantanamine (10) | 1,4-benzoquinone (10) | MeOH | A | A | good |
|  | Composition 5 | DABCO (10) | borneol (10) | IPA | A | A | good |
|  | Composition 6 | 1-adamantanamine (10) | borneol (10) | IPA | A | A | good |
|  | Composition 7 | DABCO (10) | 1-adamantanamine (10) | IPA | A | A | good |
|  | Composition 8 | 1-adamantanamine (10) | 1-adamantanamine (10) | IPA | A | A | good |
|  | Composition 9 | borneol (10) | camphor (10) | IPA | A | A | good |
|  | Composition 10 | DABCO (10) | 1-adamantanamine (10) | IPA | A | A | good |
|  | Composition 11 | camphor (10) | 1,4-benzoquinone (10) | IPA | A | A | good |
|  | Composition 12 | DABCO (10) | camphor (10) | PGEE | A | A | good |
| Comparative example | Composition 1 | DABCO (20) | — | PGEE | A | B | insufficient |
|  | Composition 2 | 1-adamantanamine (20) | — | IPA | A | B | insufficient |
|  | Composition 3 | borneol (20) | — | IPA | A | B | insufficient |
|  | Composition 4 | 1-adamantanamine (20) | — | EtOH | A | B | insufficient |
|  | Composition 5 | 1,4-benzoquinone (20) | — | MeOH | A | B | insufficient |

The remaining film of each sample is evaluated according to the following evaluation criteria. The results are described in Table 2.

A: The film thickness of the remaining film is less than 1 nm.

B: The film thickness of the remaining film is 1 nm or more. Or, the measurement beam is scattered by the crystal grains and the film thickness of the remaining film cannot be measured.

(Group A) Evaluation of Collapse Ratio

A 300 mm silicon wafer (provided by Interuniversity Microelectronics Centre (imec)) with a pillar pattern that is patterned is used. The pillar (cylinder) has a diameter of the top part of about 31 nm, a diameter of the bottom part of about 67 nm, a height of about 590 nm, and a pillar pattern with a pitch of 80 nm is formed on the entire surface of the wafer.

In order to evaluate each composition, the above wafer is cut into about 5 cm square. The cut wafer is set on a spin coater MS-A150 (Mikasa). 2 cc of each composition is The FIGURES in parentheses in the above table mean mass % of the solute based on the whole composition.

(Group B) Evaluation of Remaining Film by Sublimation

The sample after the above evaluation of sublimability is used. The measuring method and evaluation criteria are the same as in the above (Group A) evaluation of the remaining film. The results are described in Table 3.

(Group B) Evaluation of Collapse Ratio by Sublimation

A 300 mm silicon wafer (imec) with a pillar pattern that is patterned, which is used in the above (Group A) evaluation of the collapse ratio, is used.

In order to evaluate each composition, the above wafer is cut into about 5 cm square. The cut wafer is set on a spin coater MS-A150. 2 cc of each composition is dropped on the wafer and spin-coated at 1,000 rpm for 20 seconds. Immediately, the wafer is taken out and heated on a hot plate at 100° C. for 90 seconds. After this step, the measuring methods and evaluation criteria are the same as in the above evaluation of the collapse ratio. The results are described in Table 3.

Total Evaluation

The cases that the remaining film and the collapse ratio are both A are regarded as good. Others are regarded as insufficient. The results are described in Table 3.

TABLE 3

|  |  | The first solute | The second solute | Solvent | Remaining film | Collapse ratio | Total evaluation |
|---|---|---|---|---|---|---|---|
| Example | Composition 13 | hexamethylenetetramine (10) | 1,4-benzoquinone (10) | EtOH | A | A | good |
|  | Composition 14 | hexamethylenetetramine (10) | borneol (10) | IPA | A | A | good |
|  | Composition 15 | hexamethylenetetramine (10) | 1-adamantanamine (10) | IPA | A | A | good |
|  | Composition 16 | 1-adamantanol (10) | camphor (10) | IPA | A | A | good |
|  | Composition 17 | 1-adamantanol (10) | 1,4-benzoquinone (10) | IPA | A | A | good |
|  | Composition 18 | 1-adamantanol (10) | 3-methyl-1,2-cyclopentanedione (10) | IPA | A | A | good |
|  | Composition 19 | DABCO (10) | hexamethylenetetramine (10) | IPA | A | A | good |
|  | Composition 20 | borneol (10) | 1-adamantanol (10) | IPA | A | A | good |
|  | Composition 21 | hexamethylenetetramine (10) | camphor (10) | PGEE | A | A | good |
| Comparative example | Composition 6 | hexamethylenetetramine (20) | — | PGEE | A | B | insufficient |
|  | Composition 7 | trimethylolethane (20) | — | IPA | B | B | insufficient |
|  | Composition 8 | phthalic acid (20) | — | EtOH | B | B | insufficient |

The FIGURES in parentheses in the above table mean mass % of the solute based on the whole composition.

EXPLANATION OF SYMBOLS 1. substrate
2. coated carbon film layer
3. silicon-containing anti-reflective coating layer
4. resist pattern
5. gap
6. residue
7. cleaning liquid
8. residue
9. substrate pattern filling composition according to the present invention
10. pattern

The invention claimed is:

1. A substrate pattern filling composition comprising a first solute (A), a second solute (B) and a solvent (C), wherein
the first solute (A) comprises at least any one of an amino group, a hydroxy group or a carbonyl group, provided that the first solute has at most one hydroxy group per molecule;
the second solute (B) comprises at least any one of an amino group, a hydroxy group or a carbonyl group, provided that the second solute has at most one hydroxy group per molecule;
the first solute (A) and the second solute (B) are different substances; and
the first solute (A) and/or the second solute (B) each independently comprises a 5-membered or 6-membered hydrocarbon ring or heterocyclic ring and
wherein the sum of the mass of the first solute (A) and the mass of the second solute (B) is 1 to 40 mass % based on the mass of the substrate pattern filling composition.

2. The composition according to claim 1, wherein a film is formed from the substrate pattern filling composition filled in the substrate pattern, and the first solute (A) and/or the second solute (B) are independently vaporized to remove the film from the substrate pattern; and when removing the film formed from the substrate pattern filling composition, heating and/or pressure reduction are not performed.

3. The composition according to claim 1, wherein a film is formed from the substrate pattern filling composition filled in the substrate pattern, and the first solute (A) and/or the second solute (B) are independently vaporized to remove the film from the substrate pattern;
wherein the vaporization is sublimation; and
when removing the film formed from the substrate pattern filling composition, heating at 70° C. or higher and/or pressure reduction at 80 kPa or lower are not performed.

4. The composition according to claim 1, wherein the amino group and/or the carbonyl group in the first solute (A) and/or the second solute (B) are each independently a part of the ring in the hydrocarbon ring or the heterocyclic ring, and the hydroxy group is directly added to the ring in the hydrocarbon ring or the heterocyclic ring.

5. The composition according to claim 1, wherein the amino group and/or the carbonyl group in the first solute (A) and/or the second solute (B) are each independently a part of the ring in the hydrocarbon ring or the heterocyclic ring, and the hydroxy group is directly added to the ring in the hydrocarbon ring or the heterocyclic ring;
wherein the first solute (A) and/or the second solute (B) each independently has a cage-shaped steric mother structure; and
wherein the first solute (A) and/or the second solute (B) each independently has 1 to 5 amino groups, 1 to 3 carbonyl groups, and/or one hydroxy group per molecule.

6. The composition according to claim 1, wherein the molecular weight of the first solute (A) and/or the second solute (B) are each independently 80 to 300.

7. The composition according to claim 1, wherein
the mass ratio of the first solute (A):the second solute (B) is 99:1 to 1:99; and
wherein the mass of the solvent (C) is 30 to 99 mass % based on the mass of the substrate pattern filling composition.

8. The composition according to claim 1, wherein the solvent (C) comprises an organic solvent, and the organic solvent comprises at least one selected from the group consisting of alcohols, alkanes, ethers, lactic acid esters, aromatic hydrocarbons, ketones, amides and lactones.

9. The composition according to claim 1, wherein $bp_A$, $bp_B$ and $bp_C$, which are the boiling points under 1 atm respectively of the first solute (A), the second solute (B) and the solvent (C), satisfy $bp_A > bp_B > bp_C$.

10. The composition according to claim 1, wherein $bp_A$, $bp_B$ and $bp_C$, which are the boiling points under 1 atm respectively of the first solute (A), the second solute (B) and the solvent (C), satisfy $bp_A > bp_B > bp_C$; and
wherein $vp_A$, $vp_B$ and $vp_C$, which are the saturated vapor pressures at 25° C. under 1 atm respectively of the first solute (A), the second solute (B) and the solvent (C), satisfy $vp_A < vp_B < vp_C$.

11. The composition according to claim 1, wherein the first solute (A) is represented by the following formula (A) and the second solute (B) is represented by the following formula (B):

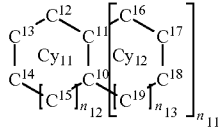

formula (A)

wherein,
$Cy_{11}$ and $Cy_{12}$ are each independently a saturated or unsaturated hydrocarbon ring or a heterocyclic ring;
$C_{n1}$ is each carbon, n1 is an integer of 10 to 19, and the remaining bonding hand of $C^{n1}$ is bonded with H;
$C^{n1}$ can be each independently replaced with —$C^{n1}R_{n1}R_{n1'}$—, —$C^{n1}(OH)$—, —$C^{n1}H$— and/or —$N^{n1}R^{n1}$—;
$R_{n1}$ and $R_{n1'}$ are each independently $C_{1-5}$ alkyl, —$NH_2$ and/or $C_{1-5}$ aminoalkyl, and $R_{n1}$ and/or $R_{n1'}$ can be combined with another $R_{n1}$, $R_{n1'}$ and/or $C^{n1}$ to form a ring; and
$n_{11}$, $n_{12}$ and $n_{13}$ are each independently 0 or 1, and,

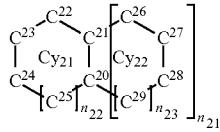

formula (B)

wherein,
$Cy_{21}$ and $Cy_{22}$ are each independently a saturated or unsaturated hydrocarbon ring or a heterocyclic ring;
$C^{n2}$ is each carbon, n2 is an integer of 20 to 29, and the remaining bonding hand of $C^{n2}$ is bonded with H;
$C^{n2}$ can be each independently replaced with —$C^{n2}R_{n2}$—, —$C^{n2}R_{n2}R_{n2'}$—, —$C^{n2}(OH)$—, —$C_{n2}(=O)$—, —$N^{n2}H$— and/or —$N^{n2}R_{n2}$—;
$R_{n2}$ and $R_{n2'}$ are each independently $C_{1-5}$ alkyl, —$NH_2$ and/or $C_{1-5}$ aminoalkyl, and $R_{n2}$ and/or $R_{n2'}$ can be combined with another $R_{n2}$, $R_{n2'}$ and/or $C^{n2}$ to form a ring; and
$n_{21}$, $n_{22}$ and $n_{23}$ are each independently 0 or 1.

12. The composition according to claim 1, wherein the first solute (A) and the second solute (B) are each independently any of phthalic anhydride, caffeine, melamine, 1,4-benzoquinone, camphor, hexamethylenetetramine, hexahydro-1,3,5-trimethyl-1,3,5-triazine, 1-adamantanol, 1,4-diazabicyclo[2.2.2]octane, borneol, (−)-borneol, (±)-isoborneol, 1,2-cyclohexanedione, 1,3-cyclohexanedione, 1,4-cyclohexanedione, 3-methyl-1,2-cyclopentanedione, (±)-camphorquinone, (−)-camphorquinone, (+)-camphorquinone or 1-adamantaneamine.

13. The composition according to claim 1, further comprising a third solute (D), wherein
the composition further comprises a fourth solute (E); and
$bp_D$ and $bp_E$, which are the boiling points under 1 atm respectively of the third solute (D) and the fourth solute (E), and $vp_D$ and $vp_E$, and which are the saturated vapor pressures at 25° C. and under 1 atm respectively of the third solute (D) and the fourth solute (E), satisfy:

$$bp_C < bp_E < bp_D < bp_B < bp_A.$$

14. The composition according to claim 1, further comprising a third solute (D), wherein
the composition further comprises a fourth solute (E); and
$bp_D$ and $bp_E$, which are the boiling points under 1 atm respectively of the third solute (D) and the fourth solute (E), and $vp_D$ and $vp_E$, which are the saturated vapor pressures at 25° C. and under 1 atm respectively of the third solute (D) and the fourth solute (E), satisfy:

$$bp_C < bp_E < bp_D < bp_B < bp_A, \text{ and}$$

wherein $vp_A < vp_B < vp_D < vp_E < vp_C$.

15. The composition according to claim 1, wherein the substrate pattern is cleaned with a cleaning liquid before applying the substrate pattern filling composition and the composition is used to replace the liquid present on the substrate.

16. The composition according to claim 13, further comprising another additive (F), wherein
the other additive (F) comprises a surfactant, an antibacterial agent, a bactericidal agent, an antiseptic agent, an antifungal agent, an acid, and/or a base; and
compared with the sum of the mass of the first solute (A) and the mass of the second solute (B), the other additive (F) is 0 to 20 mass %.

17. The composition according to claim 1, wherein the surface of the substrate on which the pattern to be filled with the composition is present is selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TiN, TaN, $Si_3N_4$, NbN, Cu, Ta, W, Hf, and Al.

18. The composition according to claim 1, wherein the surface of the substrate on which the pattern to be filled with the composition is present is selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TiN, TaN, $Si_3N_4$, NbN, Cu, Ta, W, Hf, and Al; and
wherein the surface of the substrate is a semiconductor.

19. A method for manufacturing a device comprising filling the composition according to claim 15 in a substrate pattern to form a film and vaporizing the film to remove it.

20. A substrate pattern filling composition comprising a first solute (A), a second solute (B) and a solvent (C), wherein
the first solute (A) comprises at least any one of an amino group, a hydroxy group or a carbonyl group, provided that the first solute has at most one hydroxy group per molecule;
the second solute (B) comprises at least any one of an amino group, a hydroxy group or a carbonyl group, provided that the second solute has at most one hydroxy group per molecule;
the first solute (A) and the second solute (B) are different substances; and
the first solute (A) and/or the second solute (B) each independently comprises a 5-membered or 6-membered hydrocarbon ring or heterocyclic ring and further comprising a third solute (D), wherein
the composition further comprises a fourth solute (E); and
$bp_D$ and $bp_E$, which are the boiling points under 1 atm respectively of the third solute (D) and the fourth solute (E), and $vp_D$ and $vp_E$, and which are the saturated vapor pressures at 25° C. and under 1 atm respectively of the third solute (D) and the fourth solute (E), satisfy:

$bp_C < bp_E < bp_D < bp_B < bp_A$.

\* \* \* \* \*